United States Patent
Disegni et al.

(10) Patent No.: US 10,522,220 B2
(45) Date of Patent: Dec. 31, 2019

(54) PHASE CHANGE MEMORY DEVICE WITH SELECTOR MOS TRANSISTORS AND SOURCE LINE CLUSTERING

(71) Applicant: STMicroelectronics S.r.l., Agrate Brianza (MB) (IT)

(72) Inventors: Fabio Enrico Carlo Disegni, Spino d'adda (IT); Cesare Torti, Pavia (IT); Davide Manfre', Pandino (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/056,818

(22) Filed: Aug. 7, 2018

(65) Prior Publication Data

US 2019/0051348 A1    Feb. 14, 2019

(30) Foreign Application Priority Data

Aug. 9, 2017 (IT) .......................... 102017000092225

(51) Int. Cl.
*G11C 11/00* (2006.01)
*G11C 13/00* (2006.01)

(52) U.S. Cl.
CPC ........ *G11C 13/003* (2013.01); *G11C 13/0004* (2013.01); *G11C 13/0026* (2013.01); *G11C 13/0028* (2013.01); *G11C 2213/79* (2013.01); *G11C 2213/82* (2013.01)

(58) Field of Classification Search
CPC .............. G11C 13/003; G11C 13/0026; G11C 13/0004; G11C 2213/82; G11C 2213/79
USPC ......................................................... 365/163
See application file for complete search history.

(56) References Cited

U.S. PATENT DOCUMENTS

| | | | |
|---|---|---|---|
| 9,368,203 B1 | 6/2016 | Huang et al. | |
| 2007/0159870 A1 | 7/2007 | Tanizaki et al. | |
| 2011/0267874 A1 | 11/2011 | Ryu et al. | |
| 2015/0294695 A1* | 10/2015 | Lee .................. | G11C 11/165 365/158 |
| 2018/0096727 A1* | 4/2018 | Polizzi ............... | G11C 13/0069 |

* cited by examiner

*Primary Examiner* — Huan Hoang
(74) *Attorney, Agent, or Firm* — Slater Matsil, LLP

(57) ABSTRACT

According to one embodiment, a PCM memory device includes a memory matrix having memory cells of the phase-change type organized in a plurality of word lines and bit lines. Each memory cell has a storage element and an access element including at least one MOS transistor, which is controlled to allow access to the storage element and to carry out read/programming storage operations, in which source terminals of the MOS transistors of access elements of the memory cells of the same word line are connected to the same source line. The source lines of the memory matrix are electrically short-circuited in groups. A single source line driver element for each group of source lines is configured in such a manner as to generate a respective source line driver signal in order to bias in a corresponding manner all the source lines of the respective group.

20 Claims, 4 Drawing Sheets

PHASE CHANGE MEMORY DEVICE WITH SELECTOR MOS TRANSISTORS AND SOURCE LINE CLUSTERING

CROSS-REFERENCE TO RELATED APPLICATIONS

This application claims priority to Italian Patent Application No. 102017000092225, filed on Aug. 9, 2017, which application is hereby incorporated herein by reference.

TECHNICAL FIELD

The present invention relates to a phase-change memory device, PCM or ePCM (for "embedded Phase Change Memory"), with selection MOS transistors and source line clustering (or grouping).

BACKGROUND

As is known, in integrated or "embedded" PCM memories, the storage of the information takes advantage of the characteristics of materials which have the property of switching between phases having different electrical characteristics. Such materials can switch between a disordered amorphous phase and an ordered crystalline or polycrystalline phase; with each phase is associated a significantly different value of resistivity, and consequently a different value of the stored data.

For example, the elements of group VI of the periodic table, such as Tellurium (Te), Selenium (Se), or Antimony (Sb), called chalcogenides or chalcogenic materials, are advantageously usable for the formation of phase-change memory cells; in particular, an alloy composed of germanium (Ge), antimony (Sb) and tellurium (Te), known as GST (having the chemical composition Ge2Sb2Te5) may be used in such memory cells.

The changes of phase may be obtained by locally increasing the temperature of the cells of chalcogenic material, through resistive electrodes, generally known as heaters, disposed in contact with respective regions of chalcogenic material.

Access or selection elements, in particular MOS transistors, are connected to the heaters, and selectively enable the passage of a programming electrical current; by Joule effect, this electrical current generates the temperatures necessary for the change of phase. In particular, when the chalcogenic material is in the amorphous state, at high resistivity (the state referred to as RESET), it is necessary to apply a current/voltage pulse (or a suitable number of pulses) of duration and amplitude so as to allow the chalcogenic material to cool down slowly. Being subjected to this treatment, the chalcogenic material changes its state and switches from the state of high resistivity to a state of low resistivity (the state referred to as SET). On the other hand, when the chalcogenic material is in the SET state, it is necessary to apply a current/voltage pulse of suitable duration and high amplitude in such a manner as to make the chalcogenic material return to the amorphous state at high resistivity (RESET state).

In read mode, the state of the chalcogenic material is detected by applying a voltage that is sufficiently low so as not to cause it to substantially heat up, and thus reading the value of the current that flows in the memory cell (which is again selected by means of the respective access MOS transistor). Given that the current is proportional to the conductivity of the chalcogenic material, it is possible to determine the state the material is in, and thus to gain access to the data stored in the memory cell.

In general, PCM memories offer significant advantages, amongst which are a high scalability and a high read speed combined with a reduced current consumption and a high efficiency; these advantages mean that, at least in some sectors, it is acceptable to consider that PCM memories may replace non-volatile memories of the conventional type, for example of the Flash type.

SUMMARY

According to one embodiment, a PCM memory device comprises a memory matrix having memory cells of the phase-change type organized in a plurality of word lines and bit lines. Each memory cell has a storage element and an access element including at least one MOS transistor, which is controlled to allow access to the storage element and to carry out read/programming storage operations, in which source terminals of the MOS transistors of access elements of the memory cells of the same word line are connected to the same source line, in which the word lines are biased, in use, with word line driver signals of a desired value. The source lines of the memory matrix are electrically short-circuited in groups. A single source line driver element for each group of source lines is configured in such a manner as to generate a respective source line driver signal in order to bias in a corresponding manner all the source lines of the respective group.

BRIEF DESCRIPTION OF THE DRAWINGS

For a better understanding of the present invention, some of its preferred embodiments are now described, purely by way of non-limiting example, with reference to the appended drawings, in which.

DETAILED DESCRIPTION OF ILLUSTRATIVE EMBODIMENTS

Figure 1:
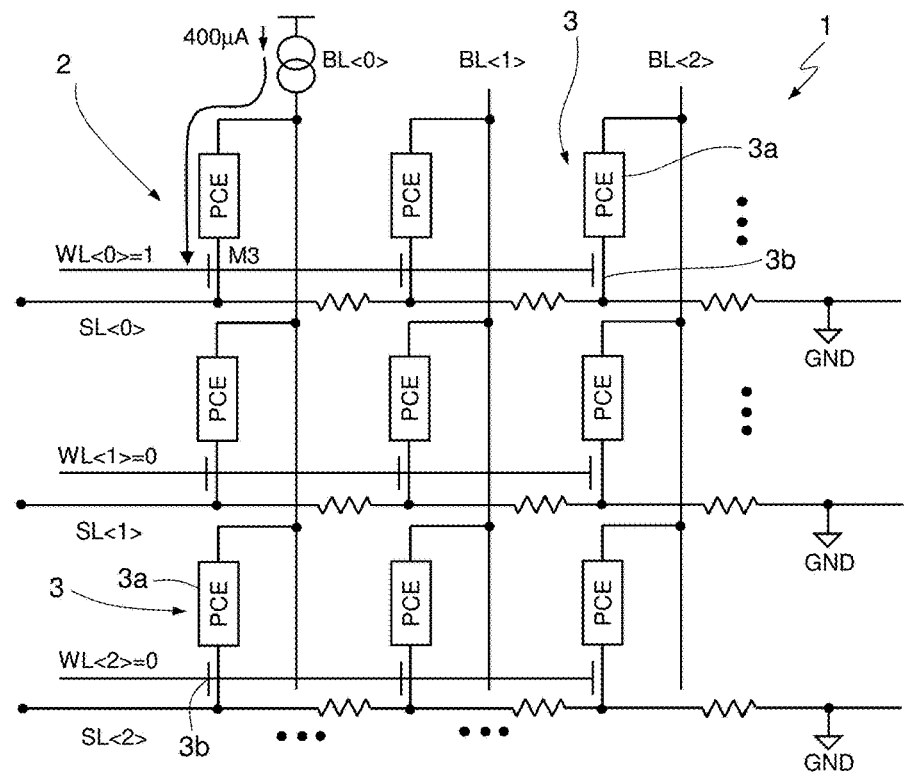
FIG. 1 shows a schematic circuit diagram of a PCM memory device, of a known type.

FIG. 1 shows a schematic circuit diagram of a PCM memory device, of a known type. As shown schematically, a PCM memory device, indicated with 1, comprises a memory matrix 2 composed of a plurality of memory cells 3, organized in 'word lines' (WL), and 'bit lines' (BT). In the layout of the memory matrix 2, the word lines WL run in a first direction of a horizontal plane, and the bit lines BL run in a second direction of the horizontal plane, transverse to the first direction.

In a manner known per se, here not discussed in detail, the memory matrix 2 is subdivided into sectors, distinct from one another and separately addressable, to which a respective number of word lines WL and of bit lines BL belong.

Each memory cell 3 is composed of one storage element 3a (indicated here and henceforth with PCE—Phase Change Element) and of one access element 3b, connected in series between a respective bit line BL and a reference line (to which, in this case, the ground reference voltage, GND, is applied, as discussed hereinbelow). The storage element 3a includes a phase-change material (for example a chalcogenide, such as GST), and is thus capable of storing data in the form of levels of resistance associated with the various phases assumed by this material.

The access element 3b is a MOS transistor having its gate terminal connected to a respective word line WL, its drain terminal connected to the storage element 3a, via a related heater element (not illustrated here), and its source terminal connected to the reference line (which is for this reason henceforth referred to as "source line SL").

The access element 3b is controlled and biased in such a manner as to allow, when selected, the passage of a read/programming (modification) current through the storage element 3a, with a suitable value and time variation profile, during respective read/programming operations, from the respective bit line BL towards the respective source line SL.

In the example illustrated in FIG. 1, a programming current, for example equal to 400 μA, is supplied to the selected bit line BL<0> for the programming in the SET state of the memory cell 2 which is selected by biasing the word line WL<0> into the high state '1' (with an analogue signal of suitable value); the relevant selection MOS transistor, indicated with M3, is therefore placed in the conducting (or closed) state, allowing the passage of the programming current.

Each word line WL connects the gate terminals of the access elements 3b aligned along the same row; similarly, a source line SL connects the source terminals of the access elements 3b aligned along the same row of the memory matrix 2 (the source lines SL run parallel to the word lines WL). In other words, the memory cells 3 of the same row of the memory matrix 2 are associated with the same word line WL and with the same source line SL.

In a known manner, not discussed in detail here, the PCM memory device 1 comprises an address decoder (not illustrated here), having a row decoder stage and a column decoder stage, which allow the memory cells 3, and in particular the related word lines WL and bit lines BL, addressed from time to time, to be selected on the basis of address signals received at the input, allowing their biasing at suitable values of voltage and current during the programming (SET, or RESET) and read operations.

Each memory cell 3 may therefore be selected for the programming operations by means of the selection (or biasing) of a respective word line WL and of a respective bit line BL.

As indicated in FIG. 1, the memory matrix 2 comprises, for each sector, a certain number of word lines WL<0>, WL<1>, WL<2>, etc. (and of corresponding source lines SL), and a certain number of bit lines BL<0>, BL<1>, BL<2>, etc.

Typically, only one word line at a time per sector (in FIG. 1 the word line WL<0>) is addressed and selected for the storage operations. The word lines WL not selected for the read/programming operations (in FIG. 1 indicated with WL<1>, WL<2>, etc.) are biased at the low state '0' (with an analogue signal of suitable value, for example lower than the biasing signal for the high state), in such a manner as to turn off the access elements 3b (and the relevant MOS transistors) associated with the same word line WL, or to set the latter to the open state; furthermore, the bit lines BL not selected for the read/programming operations (in the figure indicated with BL<1>, BL<2>, etc.) are placed in a floating state.

As previously indicated, in the embodiment illustrated, all the source lines SL of the sector of the memory matrix 2 are placed at the ground voltage GND, hence all being short-circuited together.

The present applicant has verified that this solution has some limitations and problematic aspects.

In particular, memory cells 3 not selected (i.e., their word line WL is placed at the low value, WL='0'), associated with the selected bit line BL (in the example BL<0>), can generate dispersion or leakage currents, which are injected into the source line SL of the selected memory cells. These leakage currents are due to the currents in the OFF state, called Ioff currents, of the MOS transistors of the selection elements 3b associated with the aforementioned memory cells 3 not selected (which are running with a voltage between the gate and source terminals, VGS, substantially zero, VGS=0).

These leakage currents, generated by the MOS transistors of the selection elements 3b of the memory cells 3 not selected, which are located on the same bit line BL as a selected memory cell, can modify the read/programming currents, representing an interference factor for the correct operation of the memory device 1.

In reality, the solution described in the aforementioned FIG. 1 is in fact only applicable for memory matrices 2 of reduced dimensions, or with sectors of reduced dimensions in terms of number of rows and columns, in which the effect of the aforementioned leakage currents may accordingly be considered as substantially negligible.

In order to limit the problem described, one solution which has been proposed provides the biasing of the source lines SL not selected, i.e., associated with the word lines WL of the memory matrix 2 which are not selected for the read/programming operations, with voltage values that are higher than the ground reference voltage. In this way, the MOS transistors of the selection elements 3b of the memory cells 3 not selected which are associated with the selected bit line BL are in a harder OFF condition, the voltage between the gate terminals and source being set at a negative value, VGS<0 (under the assumption of an example using N-channel MOS transistors for the selection elements 3b), having a reduced value of the relevant OFF currents Ioff.

Figure 2:
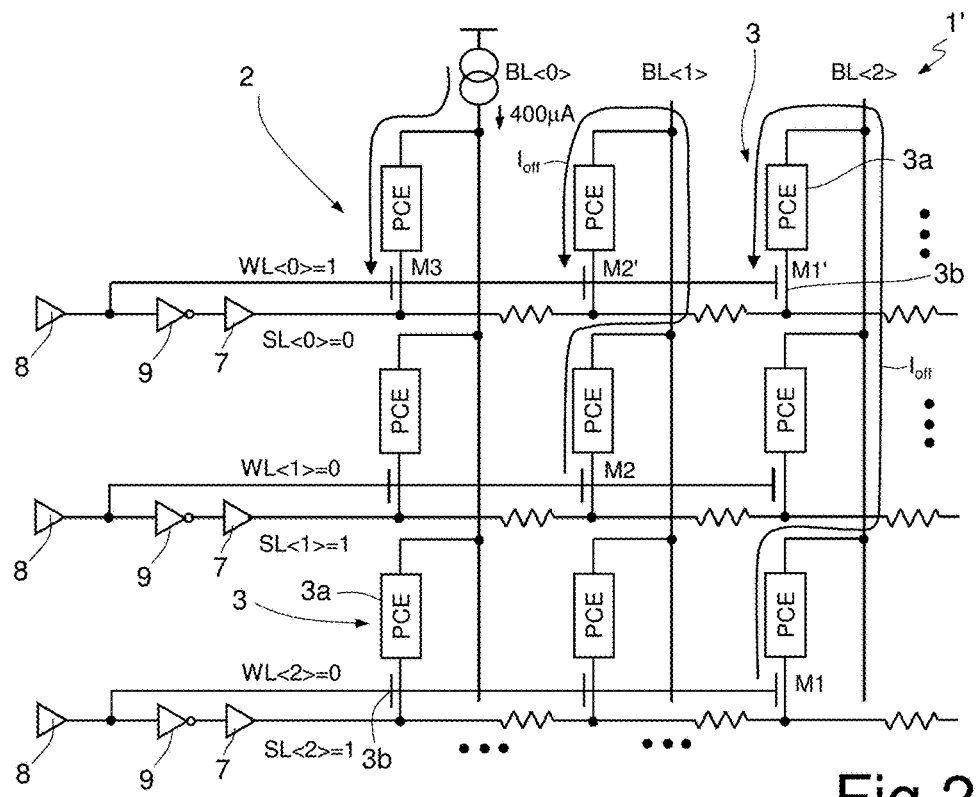
FIG. 2 shows a schematic circuit diagram of a PCM memory device, also of a known type, with a different solution for biasing the source lines SL of the related memory matrix.

This solution is illustrated in FIG. 2, which shows a memory device, indicated here with 1', in which the source lines SL, instead of all being biased at the ground reference voltage GND, are separately and individually biasable at a respective high voltage, '1' state, or low voltage, '0' state (the latter coinciding for example with the ground reference voltage GND).

In particular, for each source line SL, a respective source line driver element 7 is present, which supplies the source line biasing signal VSL of the required value (in terms of voltage) and furthermore has an adequate current driving capacity.

In the example illustrated, in which only the word line WL<0> is selected (set at the high value '1'), only the corresponding source line SL<0> is biased at the low value '0', whereas the remainder of the source lines of the sector (indicated with SL<1>, SL<2>, etc.) are biased at the high state '1' by the respective source line drivers 7.

In particular, in this solution, the source line drivers 7 are controlled by the negated value of the respective word line WL.

The memory device 1 actually comprises: a plurality of word line drivers 8, one for each word line WL, each capable of supplying a word line biasing signal VWL, of the required value, to the respective word line WL; and a plurality of inverter elements 9, each interposed between the output of a respective word line driver 8 and the input of a respective source line driver 7.

It is clear that, in the case in which the word line driver 8 generates a word line signal VWL of high value (VWL='1') for the selection of the respective word line WL, the respective source line driver SL receives at its input a voltage of low value (generated by the inverter element 9), accordingly supplying at its output a source line signal VSL of low value (VSL='0'). Similarly, in the case in which the word line driver 8 generates a word line signal VWL of low value (VWL='0') for the non-selection of the word line WL, the respective source line driver SL receives at its input a voltage of high value (generated by the inverter element 9), accordingly supplying at its output a source line signal VSL of high value (VSL='1').

The solution described allows the problems associated with the leakage currents of the memory cells 3 not selected in the memory matrix 2, associated with the selected bit line BL, to be reduced.

However, in this solution, the memory cells 3 not selected which are associated with the bit lines BL not selected generate leakage currents which are all channeled into the source line SL associated with the selected word line.

For example, in FIG. 2, by way of example, the currents Ioff injected into the source line SL<0> by the MOS transistor M1 of the memory cell addressed by the word line WL<2> (not selected, WL<2>='0') and by the bit line BL<2> (in a floating state), and by the MOS transistor M2 of the memory cell addressed by the word line WL<1> (this also not selected, WL<1>='0') and by the bit line BL<1> (this also in a floating state) are indicated; these currents Ioff flow along the bit line BL<2>, or respectively BL<1>, and are injected into the source line SL<0> through the MOS transistor M1', or respectively M2', which are in the conducting state (in as much as the relevant word line WL<0> is selected, i.e., is in the high state, and the aforementioned source line SL<0> is set at ground GND).

As a consequence of the parallelism in read and programming and of the dimensions of the sector of the memory matrix 2, the value of the overall leakage current injected into the source line SL can be high, with a consequent undesirable drop in voltage (due to the intrinsic resistance of the line, indicated schematically in the FIG. 2). This leakage current furthermore increases with increasing operating temperatures of the memory device 1.

In particular, in the case in which the dimensions of the sector of the memory matrix 2 are large, the value of the current injected due to the leakage phenomenon can even be of the order of a mA.

Accordingly, this solution therefore has some problematic features which discourages its use at least in some applications, in the case for example in which the sectors of the memory matrix have large dimensions (for example 2048 bit lines BL for 512 word lines WL) and reduced dimensions are at the same time required for the memory device 1, as may for example happen in the case of portable or mobile equipment, or of applications in the automotive field, or, in general, in the case in which a reduction in cost is required.

This solution in fact requires a significant occupation of surface area, indeed requiring one driver for each source line SL that has to be individually biasable. These drivers must furthermore be designed in an appropriate manner in order to sustain the current required on the respective source lines SL (also taking the leakage into consideration), hence, in general, having large dimensions. Furthermore, typically several metallizations must be used in parallel in order to reduce the resistance of each source line SL.

Embodiments of the present invention solve, at least in part, problems previously highlighted.

As will be described in the following, one aspect of the present solution includes short-circuiting, in groups or "clusters", the source lines SL of the memory matrix 2, and biasing each group of source lines SL with a single source line driver, supplying a biasing signal of suitable value.

According to a further aspect of the present solution, the aforementioned value of the source line biasing signal is determined by means of a suitable logical combination of the signals for biasing the word lines WL associated with the source lines SL of the group.

Figure 3:
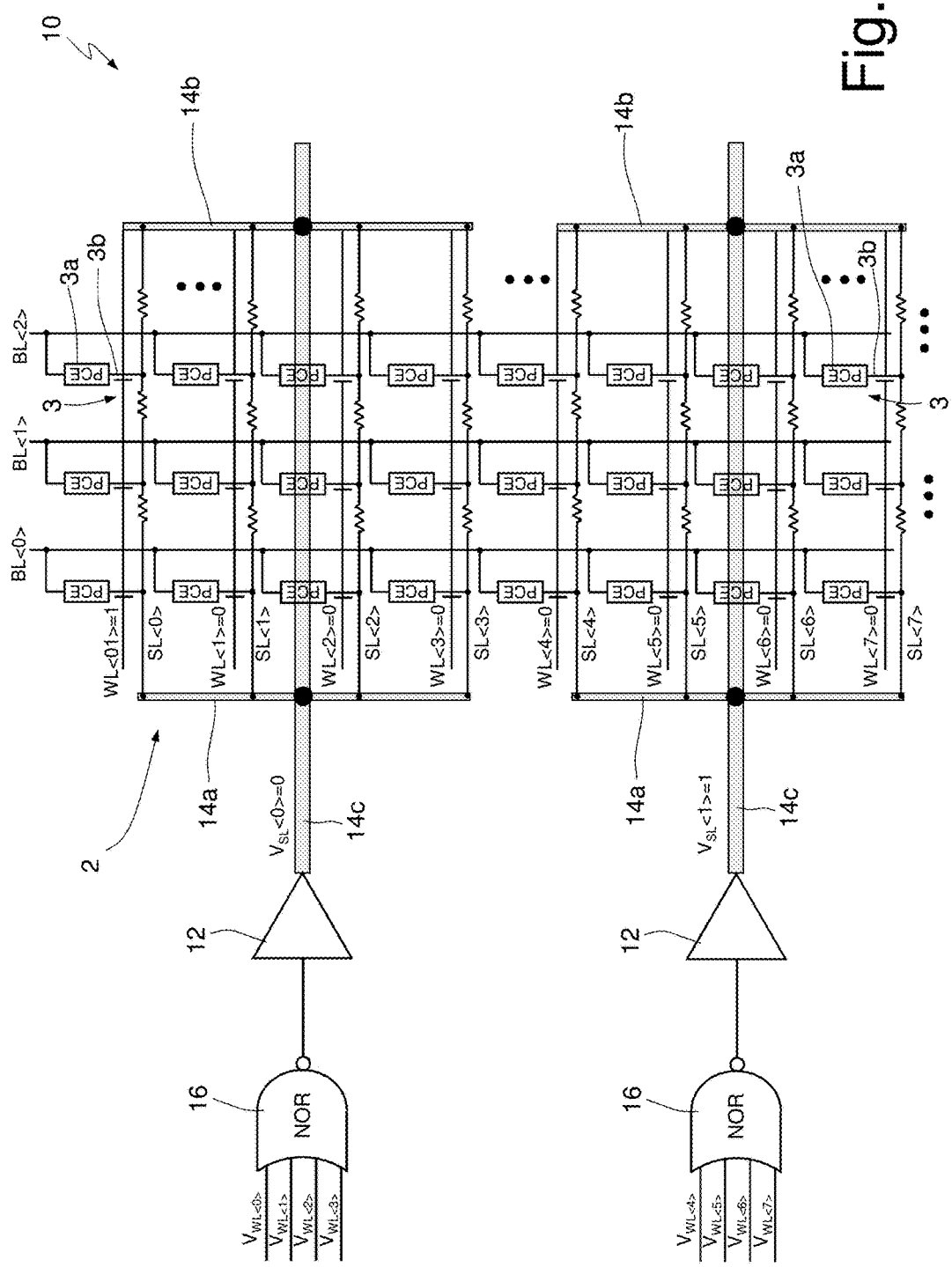
FIG. 3 shows a schematic circuit diagram of a PCM memory device, according to a first embodiment of the present solution.

FIG. 3 shows a PCM memory device according to one embodiment of the present solution, indicated overall with 10.

The PCM memory device 10 is fabricated in a manner substantially analogous to what has previously been discussed, with reference to FIGS. 1 and 2, indeed comprising a memory matrix 2 having a plurality of memory cells 3 organized in rows, word lines WL, and columns, bit lines BL, each memory cell 3 being defined by a phase-change storage element 3a and by a respective selection element 3b, consisting of a MOS transistor. As previously indicated, the source terminals of the MOS transistors of the selection elements 3b of the memory cells 3 of the same row are connected to the same source line SL.

Each memory cell 3 is addressable, for the read and programming operations, by means of the suitable selection and biasing of the respective word line WL and of the respective bit line BL. In particular, word line drivers (not illustrated here) generate appropriate biasing signals VWL for each word line WL of each sector of the memory matrix 2.

According to one particular aspect of the present solution, a group or "cluster" of source lines SL, purely by way of illustration comprising four source lines SL in the example illustrated in FIG. 3, are short-circuited together, i.e., mutually electrically connected in parallel, and biased by the same source line biasing signal VSL generated by a single respective source line driver 12.

As indicated in the aforementioned FIG. 3, in the embodiment illustrated, the source lines SL of the same group are electrically connected in parallel, in the example by means of at least a first and a second vertical metallization track 14a, 14b; in particular, the first vertical metallization track 14a connects together the first ends of the respective source lines SL (considering their horizontal extension), and the second vertical metallization track 14b connects together the second ends of the respective source lines SL, opposite to the first ends along the aforementioned horizontal extension. Furthermore, still in the aforementioned example, a longitudinal metallization track 14c, having a horizontal extension parallel to the source lines SL, connects together the first and the second vertical metallization tracks 14a, 14b, and is furthermore connected to the respective source line driver 12, so as to receive the source line biasing signal VSL from the same source line driver 12.

In the aforementioned FIG. 3, by way of example, two groups, or clusters, of source lines SL are illustrated that are short-circuited together, formed: by the source lines SL<0>, SL<1>, SL<2> and SL<3>, biased by a source line biasing signal VSL<0> generated by a respective source line driver 12; and, respectively, by the source lines SL<4>, SL<5>, SL<6> and SL<7> of the sector of the memory matrix 2, biased by the source line biasing signal VSL<1> generated by the respective source line driver 12.

Advantageously, this solution allows the number of source line drivers 12 required in the memory device 10 to be reduced and a corresponding decrease in the surface area occupied to be obtained; furthermore, given that the source lines SL of each group are short-circuited together, the overall line resistance is reduced, accordingly reducing the undesirable drop in voltage.

According to a further aspect of the present solution, each source line driver 12 generates the respective source line biasing signal VSL as a function of the logical combination of the word line biasing signals VWL of the word lines WL corresponding to the source lines SL of the respective group (i.e., the word lines WL relating to the same memory cells 3 to which the aforementioned source lines SL relate).

In detail, as shown in the same FIG. 3, the memory device 10 comprises, for each group of source lines SL and for each source line driver 12, a respective NOR logical combination stage 16, which has: an output connected to the input of the source line driver 12; and inputs each receiving a respective word line biasing signal VWL of a corresponding word line WL.

The NOR logical combination stage 16 carries out the NOR logical combination of the word line biasing signals VWL received at the input and generates at the output a NOR logical combination signal, supplied to the input of the source line driver SL.

In the example illustrated, each NOR logical combination stage 16 has four inputs: in particular, the NOR logical combination stage 16 associated with the first group of source lines SL receives the word line biasing signals VWL<0>, VWL<1>, VWL<2> and VWL<3> at its input; and the NOR logical combination stage 16 associated with the second group of source lines SL receives the word line biasing signals VWL<4>, VWL<5>, VWL<6> and VWL<7> at its input.

In a manner that will be clear, it is sufficient for one of the word lines WL of the group to be selected, i.e., biased at the high state (VWL='1'), since the source line biasing signal VSL of the same group is set in the low state (VSL='0'). Similarly, in the case in which all the word lines of the group are not selected, i.e., they are biased at the low state (VWL='0'), the source line biasing signal VSL of the same group is set in the high state (VSL='1').

In the example illustrated in FIG. 3, therefore, assuming that the word line WL<0> is high (WL<0>='1'), the source line biasing signal VSL<0> is low (VSL<0>='0') and the source line biasing signal VSL<1> is high (VSL<1>='1').

Advantageously, the solution described allows the source lines SL of the groups corresponding to the word lines WL not selected to be biased with a high biasing voltage, accordingly reducing the effect of the leakage currents of the MOS transistors of the selection elements 3b of the memory cells 3 not selected, associated with the selected bit line BL.

Furthermore, the source line drivers 12 and the same source lines SL may be dimensioned appropriately so as to take into account the overall effect of the leakage due to the OFF currents Ioff of the MOS transistors of the selection elements 3b of the memory cells 3 not selected, associated with bit lines BL not selected.

The number of source lines SL that compose a group and which are short-circuited together depends, amongst other things, on the leakage current that may be tolerated during the read and programming operations: indeed, inside of the group, the MOS transistors of the selection elements 3b of the memory cells 3 associated with the selected bit line BL have their source terminal at the ground reference voltage GND and have a voltage VGS of substantially zero, hence contributing to the leakage current.

It will in any case be convenient to establish, at the design stage of the memory device 10, a suitable compromise between the reduction in area, associated with the reduction in the number of source line drivers 12, and the amount of leakage which can be tolerated, furthermore dimensioning appropriately, as previously indicated, the same source line drivers 12 and the same source lines SL.

A further embodiment of the present solution will now be described.

Figure 4:
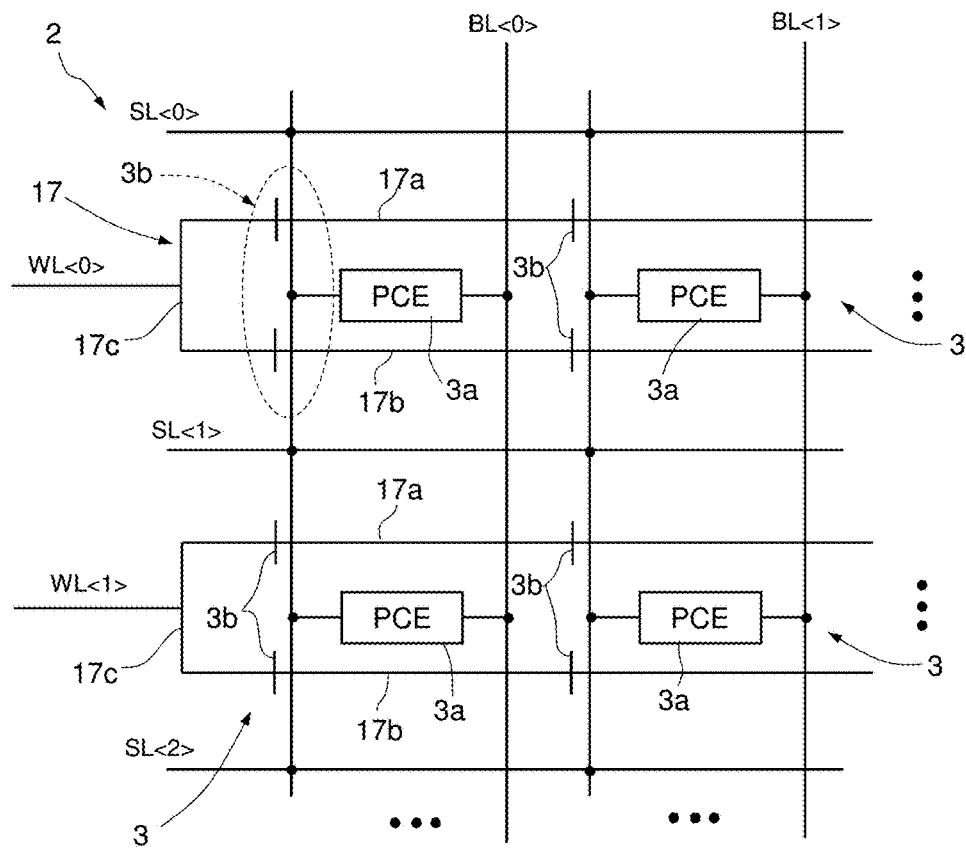
FIG. 4 shows a schematic circuit diagram of a portion of the memory matrix of a PCM memory device, according to one aspect of the present solution.

In a known manner, and as illustrated in FIG. 4, the selection elements 3b may be formed with a layout that provides split gate lines 17 (associated with the word lines WL), each having a first and a second portion 17a, 17b facing a respective source line SL and at least one connection portion 17c disposed at a first end portion of these gate lines 17.

The gate lines 17 and the source lines SL run parallel to one another and parallel to the word lines WL, along a first horizontal axis; the bit lines BL run transverse to these gate lines 17 and source lines SL, along a second horizontal axis.

Each selection element 3b is, in this case, composed of two MOS transistors, whose source terminals are connected to respective source lines SL, adjacent to one another and both adjacent to the respective gate line 17; the aforementioned two MOS transistors are jointly set into the closed or open state by the respective word line signal VWL.

Each source line SL is facing, and shared between, two adjacent word lines WL in the memory matrix 2. For example, with reference to the example illustrated in FIG. 4, the source line SL<1> is associated with, and shared between, the word lines WL<0> and WL<1>.

This solution is advantageous in that, for equal surface area occupied by the memory cell 3, the current capacity of the selection elements 3b of the memory cells 3 is increased.

Figure 5:
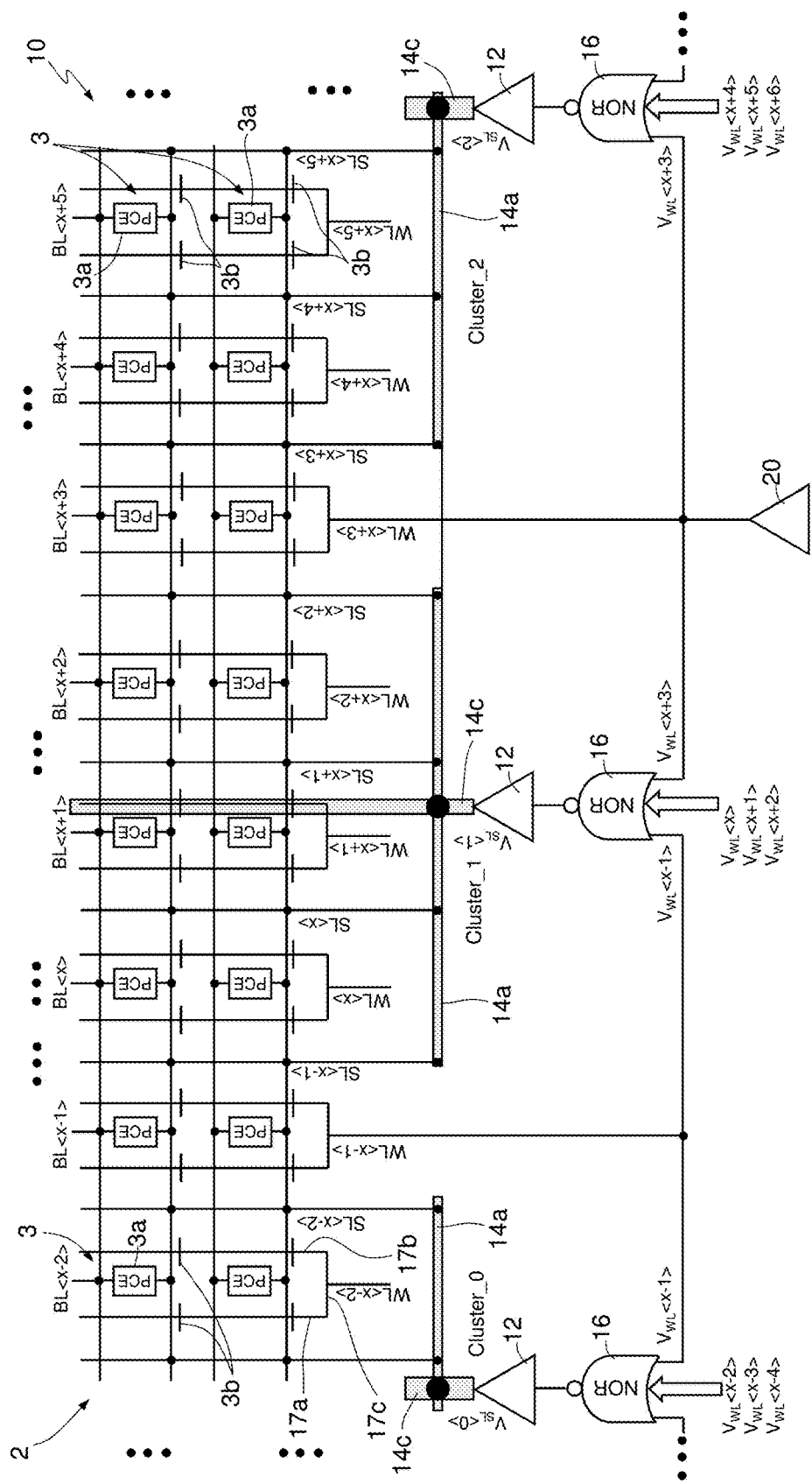
FIG. 5 shows a schematic circuit diagram of a PCM memory device, in accordance with a second embodiment of the present solution.

As shown in FIG. 5, in this embodiment, it is necessary to take into account the fact that some word lines WL are operationally coupled to source lines SL which belong to two different groups, or clusters.

For example, the word line WL<x−1> in the example in FIG. 5 is coupled both to the source line SL<x−2> which belongs to a first group of source lines SL short-circuited together (indicated as Cluster_0), and to the source line SL<x−1>, which belongs to a second, separate, group of short-circuited source lines SL (indicated as Cluster_1).

As a consequence, the biasing signal VWL<x−1> of the aforementioned word line WL<x−1> (shared between the two groups of source lines) is received at the input both by the NOR logical combination stage 16 coupled to the source line driver 12 that supplies the source line biasing signal VSL<0> to the first group of source lines, and by the NOR logical combination stage 16 coupled to the source line driver 12 that supplies the source line biasing signal VSL<1> to the second group of source lines.

In other words, in this case, the aforementioned logical combination stage 16 has five inputs (considering a group of four source lines SL; in general m+1 inputs, considering a group of m source lines SL) for receiving at the input the word line biasing signals VWL of the word lines WL operationally coupled to the source lines SL of the respective group, including the "boundary" word lines, shared with the adjacent groups of source lines in the memory matrix 2.

For example, therefore, the logical combination stage 16 of the second group of source lines SL (Cluster_1) receives at its input the following word line biasing signals VWL: VWL<x−1> (which is also received by the logical combination stage 16 associated with the preceding group of source lines SL, Cluster_0), VWL<x>, VWL<x+1>, VWL<x+2> and VWL<x+3> (which is also received by the logical combination stage 16 associated with the successive group of source lines SL, Cluster_2).

It will be noted that the aforementioned FIG. 5 shows, by way of example, a single word line driver, here indicated with 20, designed to supply the word line biasing signal VWL<x+3> to the corresponding word line WL<x+3>; it should, however, be understood that, with each word line WL of the sector of the memory matrix 2, a respective word line driver 20 is associated.

It is clear that, in this solution, both the groups of source lines SL, that are associated with a "boundary" word line WL which is selected in read or programming mode, are set in the low state (i.e., at the ground reference voltage GND); there are accordingly situations in which, to contribute to the current leakage, there are the memory cells which belong to both the groups of source lines, which are thus able to result in a certain increase in the leakage current, due to the greater number of source lines SL that are biased at the low value, compared with the first embodiment illustrated with reference to FIG. 3.

Consequently, in this case, the right compromise between the number of source lines SL in each group and the permitted amount of leakage during the storage operations can be even more important.

The advantages of the solution described are clearly apparent from what has been discussed.

In any case, it is again underlined that the solution provided allows the leakage currents inside the non-volatile memory device to be reduced, which proves to be particularly useful in the case of memory devices having sectors with a high number of word lines WL and/or bit lines BL and/or in which a high level of parallelism in the read and programming operations is adopted. In particular, the effect on the programming/read currents of the leakage currents due to the memory cells not selected which are associated with the selected bit line is reduced.

Furthermore, the short-circuiting of the source lines SL inside of each group reduces the overall resistance of these source line SL, accordingly decreasing the undesirable voltage drop.

The memory device 10 is therefore particularly indicated in an electronic system, for example for automotive, or similar, applications.

Figure 6:
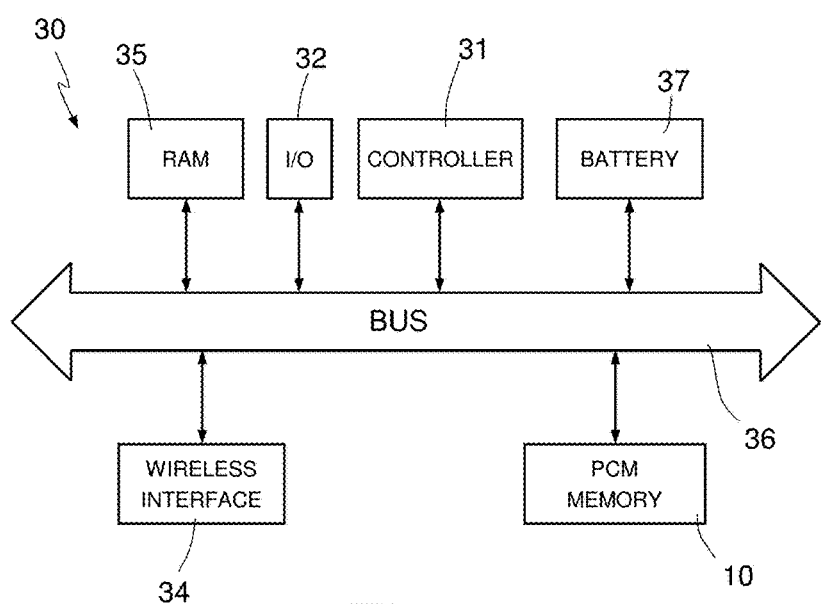
FIG. 6 shows a block diagram of an electronic device incorporating the PCM memory device.

In this regard, FIG. 6 shows a portion of such an electronic system, indicated with 30, generally capable of processing, storing, transmitting and receiving information.

In detail, the electronic system 30 comprises: a controller 31 (for example equipped with a microprocessor, a DSP, or a microcontroller); an input/output device 32 (for example provided with a keyboard and a display), for inputting and displaying data; the non-volatile PCM memory device 10, previously described; a wireless interface 34, for example an antenna, for transmitting and receiving data through a radiofrequency wireless communications network; and a RAM memory 35, all coupled through a digital bus 36. A battery 37 could be used as electrical power source in the electronic system 30.

Finally, it is clear from what has been described and illustrated here that modifications and variants may be applied, without however straying from the scope of protection of the present invention, as defined in the appended claims.

In particular, it is again underlined that any suitable number of source lines SL may be provided inside of each group (or cluster); furthermore, a different number of source lines SL could be provided in one or more of the groups of source lines SL with respect to the other groups present inside of the same sector of the memory matrix 2.

Furthermore, the solution described may advantageously be applied to several non-volatile memory devices (for example "embedded" or "stand alone" devices), in which MOS transistors are used for the selection and biasing of corresponding memory cells and in which similar problems of leakage and of occupation of surface area arise.

What is claimed is:

1. A PCM memory device, comprising:
   a plurality of word lines;
   a plurality of bit lines;
   a plurality of source lines;
   a plurality of phase-change memory cells organized in an array of rows and columns, each row of memory cells being coupled to a respective one of the word lines and each column of memory cells being coupled to a respective one of the bit lines, each memory cell having a storage element and an access element that includes a MOS transistor; and
   a plurality of source line drivers;
   wherein source terminals of the MOS transistors of the access elements of the memory cells of the same word line are coupled to the same source line;
   wherein the source lines of the memory matrix are electrically short-circuited in groups; and
   wherein each group of source lines is driven by a single source line driver that is configured to generate a respective source line driver signal in order to bias all the source lines of the respective group in a corresponding manner, wherein each source line driver is configured to generate the respective source line driver signal as a function of a logical combination of word line driver signals of the word lines associated with the source lines of the respective group.

2. The device according to claim 1, further comprising a logical combination stage for each group of source lines, the logical combination stage having inputs coupled to receive the word line driver signals of the word lines associated with the source lines of the respective group, and having an output connected to the respective source line driver.

3. The device according to claim 2, wherein the logical combination stage is configured to implement a NOR logical combination of the word line driver signals received at the input.

4. The device according to claim 2, wherein each source line is shared by a pair of adjacent word lines and wherein the logical combination stage has inputs coupled to receive the word line driver signals of the pairs of word lines adjacent to each source line of the respective group.

5. The device according to claim 4, wherein each of the access element comprises two MOS transistors with source terminals coupled to the respective source line, the two MOS transistors being adjacent to one another in the array and both jointly set into a closed state or an open state by the respective word line signal.

6. The device according to claim 1, wherein each source line driver is configured to bias the source lines of the respective group into a low state when at least one of the word lines associated with the source lines of the respective group is selected for a storage operation, and to bias the source lines of the respective group into a high state when none of the word lines associated with the source lines of the respective group is selected for the storage operations.

7. The device according to claim 1, wherein the source lines of the same group are short-circuited together and electrically connected in parallel one or more metallization tracks.

8. The device according to claim 1, wherein the array is subdivided into sectors, each sector comprising a plurality of the groups of source lines and of respective source line driver elements.

9. An electronic system, comprising:
the PCM memory device according to claim 1; and
a control and processing unit operationally coupled to the PCM memory device.

10. The electronic system according to claim 9, wherein the PCM memory device and the control and processing unit are integrated into a single semiconductor chip.

11. A method of operating a PCM memory device that comprises a memory matrix having phase-change memory cells organized in a plurality of source lines, word lines and bit lines, each memory cell having a storage element and an access element that includes a MOS transistor, wherein source terminals of the MOS transistors of access elements of the memory cells of the same word line are connected to the same source line and wherein the source lines of the memory matrix are electrically short-circuited in groups, the method comprising:
biasing the word lines of the memory matrix to be selected during storage operations with word line driver signals to a first level different from a second level to which the word lines of the memory matrix not to be selected during the storage operations are biased; and
generating a single source line driver signal for each group of electrically short-circuited source lines so that that all the source lines of each group of source lines are biased with a common voltage level based on a respective source line driver signal, wherein generating the respective source line driver signals comprises generating each respective source line driver signal as a function of a logical combination of the word line driver signals of the word lines associated with the source lines of the respective group.

12. The method according to claim 11, wherein generating each respective source line driver signal as a function of a logical combination of the word line driver signals comprises implementing a NOR logical combination of the word line driver signals of the word lines associated with the source lines of the respective group.

13. The method according to claim 11, wherein each source line is shared by a pair of adjacent word lines, and wherein generating the respective source line driver signal comprises performing a logical combination between the word line driver signals of the pairs of word lines adjacent to each source line of the respective group.

14. The method according to claim 11, wherein generating the respective source line driver signals comprises:
causing the source lines of the respective group to be biased into a low state when at least one of the word lines associated with the source lines of the respective group is selected for a storage operation; and
causing the source lines of the respective group to be biased into a high state when none of the word lines associated with the source lines of the respective group is selected for a storage operation.

15. A method of operating a PCM memory device that comprises phase-change memory cells organized in a plurality of source lines, word lines and bit lines, each memory cell having a storage element and an access element, wherein the access elements of the memory cells of the same word line are connected to the same source line and wherein the source lines of the memory matrix are electrically short-circuited in groups, the method comprising:
receiving a command for a storage operation for a selected memory cell coupled to a selected bit lines, a selected word line and a selected source line;
biasing the selected word line to a first level;
biasing unselected word lines to a second level different than the first level;
biasing all of the source lines of the group of source lines that includes the selected source line into a low state; and
biasing the source lines of other groups of source lines into a high state, wherein biasing all of the source lines of the group of source lines that includes the selected source line and biasing the source lines of other groups of source lines comprises generating a respective source line driver signal for each group by implementing a NOR logical combination of word line driver signals of the word lines associated with the source lines of the respective group.

16. The method according to claim 15, wherein biasing all of the source lines of the group of source lines that includes the selected source line comprises using a single source line driver to generate a single source line driver signal that causes all of the source lines of the group of source lines that includes a selected source line to be biased into the low state.

17. The method according to claim 15, wherein each source line is shared by a pair of adjacent word lines, and wherein generating each respective source line driver signal comprises performing a logical combination between the word line driver signals of the pairs of word lines adjacent to each source line of the respective group.

18. A PCM memory device, comprising:
a plurality of word lines;
a plurality of bit lines;
a plurality of source lines;
a plurality of phase-change memory cells organized in an array of rows and columns, each row of memory cells being coupled to a respective one of the word lines and each column of memory cells being coupled to a respective one of the bit lines, each memory cell having a storage element and an access element comprising two MOS transistors coupled to a common word line from the plurality of word lines; and
a plurality of source line drivers;
wherein source terminals of the MOS transistors of the access elements of the memory cells of the same word line are coupled to the same source line;
wherein the source lines of the memory matrix are electrically short-circuited in groups; and
wherein each group of source lines is driven by a single source line driver that is configured to generate a respective source line driver signal in order to bias all the source lines of the respective group in a corresponding manner, wherein source terminals of the two MOS transistors are coupled to the respective source line, the two MOS transistors being adjacent to one another in the array and both jointly set into a closed state or an open state by a word line signal on the respective common word line.

19. The device according to claim 18, further comprising a logical combination stage for each group of source lines, the logical combination stage having inputs coupled to receive word line driver signals of the word lines associated with the source lines of the respective group, and having an output connected to the respective source line driver.

20. The device according to claim 19, wherein the logical combination stage is configured to implement a NOR logical combination of the word line driver signals received at the input.

* * * * *